United States Patent
Eiyama

(10) Patent No.: US 12,092,524 B2
(45) Date of Patent: Sep. 17, 2024

(54) OPTICAL SENSOR

(71) Applicant: Murata Manufacturing Co., Ltd., Nagaokakyo (JP)

(72) Inventor: Daichi Eiyama, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 289 days.

(21) Appl. No.: 17/719,516

(22) Filed: Apr. 13, 2022

(65) Prior Publication Data

US 2022/0236111 A1    Jul. 28, 2022

Related U.S. Application Data

(63) Continuation of application No. PCT/JP2020/038497, filed on Oct. 12, 2020.

(51) Int. Cl.
   *G01J 5/04*      (2006.01)
   *G01J 5/02*      (2022.01)
   *G01J 5/0802*    (2022.01)

(52) U.S. Cl.
   CPC ........... *G01J 5/046* (2013.01); *G01J 5/0215* (2013.01); *G01J 5/0225* (2013.01); *G01J 5/0802* (2022.01)

(58) Field of Classification Search
   CPC ........ G01J 5/046; G01J 5/0215; G01J 5/0225; G01J 5/0802; G01J 5/023; G01J 5/04; H01L 31/0203
   See application file for complete search history.

(56) References Cited

U.S. PATENT DOCUMENTS

| | | | |
|---|---|---|---|
| 4,808,812 A | 2/1989 | Tanaka et al. | |
| 6,294,783 B1 | 9/2001 | Hayashi | |
| 9,761,740 B2* | 9/2017 | Reinert | G01J 5/20 |
| 11,698,295 B2* | 7/2023 | Watanabe | G01J 1/0271 |
| | | | 250/552 |
| 2002/0175285 A1* | 11/2002 | Ito | G01J 5/34 |
| | | | 250/338.3 |
| 2007/0114415 A1 | 5/2007 | Hayashi | |
| 2007/0176516 A1* | 8/2007 | Nagaya | G01P 15/0907 |
| | | | 310/346 |
| 2008/0087824 A1 | 4/2008 | Hayashi et al. | |
| 2010/0006315 A1* | 1/2010 | Kumatani | H01L 23/10 |
| | | | 174/50.5 |

(Continued)

FOREIGN PATENT DOCUMENTS

| | | |
|---|---|---|
| CN | 106768389 A | 5/2017 |
| JP | 63-176 A | 1/1988 |

(Continued)

OTHER PUBLICATIONS

Official Communication issued in International Patent Application No. PCT/JP2020/038497, mailed on Dec. 28, 2020.

*Primary Examiner* — David P Porta
*Assistant Examiner* — Gisselle M Gutierrez
(74) *Attorney, Agent, or Firm* — Keating & Bennett, LLP

(57) ABSTRACT

An optical sensor includes a light receiver and a circuit portion electrically connected to the light receiver, and the circuit portion includes a substrate, an electronic component on the substrate, a resin covering the electronic component, and a metal pillar electrically connected to the electronic component and including a portion covered with the resin and a portion exposed from the resin, and the light receiver is located on the circuit.

16 Claims, 4 Drawing Sheets

(56) References Cited

U.S. PATENT DOCUMENTS

| | | | |
|---|---|---|---|
| 2011/0114840 A1* | 5/2011 | Yamazaki | H01L 21/54 |
| | | | 29/841 |
| 2011/0266443 A1* | 11/2011 | Schimert | G01J 5/024 |
| | | | 250/353 |
| 2012/0228503 A1* | 9/2012 | Nishikawa | G01J 5/04 |
| | | | 250/338.3 |
| 2012/0298867 A1* | 11/2012 | Nishikawa | G01J 5/0018 |
| | | | 250/338.3 |
| 2013/0126735 A1 | 5/2013 | Plotz et al. | |
| 2016/0049434 A1 | 2/2016 | Barlow et al. | |
| 2016/0223398 A1* | 8/2016 | Murata | G01J 1/42 |
| 2018/0070829 A1* | 3/2018 | Iwawaki | A61B 5/335 |
| 2018/0306638 A1* | 10/2018 | Ishikawa | G01J 3/10 |
| 2019/0316967 A1* | 10/2019 | Schieferdecker | G01J 5/0853 |
| 2022/0236111 A1* | 7/2022 | Eiyama | G01J 5/0225 |
| 2022/0236112 A1* | 7/2022 | Matsui | G01J 5/04 |
| 2023/0194350 A1* | 6/2023 | Takiguchi | G01J 5/06 |
| | | | 374/130 |

FOREIGN PATENT DOCUMENTS

| | | | | |
|---|---|---|---|---|
| JP | 06-28663 U | 4/1994 | | |
| JP | 11-108757 A | 4/1999 | | |
| JP | 2001-124624 A | 5/2001 | | |
| JP | 2011237451 A * | 11/2011 | | G01J 1/02 |
| JP | 2012-013584 A | 1/2012 | | |
| JP | 2013-524178 A | 6/2013 | | |
| JP | 2016-042080 A | 3/2016 | | |
| WO | 2006/009174 A1 | 1/2006 | | |
| WO | 2006/120863 A1 | 11/2006 | | |

* cited by examiner

OPTICAL SENSOR

CROSS REFERENCE TO RELATED APPLICATIONS

This application claims the benefit of priority to Japanese Patent Application No. 2019-207690 filed on Nov. 18, 2019 and is a Continuation Application of PCT Application No. PCT/JP2020/038497 filed on Oct. 12, 2020. The entire contents of each application are hereby incorporated herein by reference.

BACKGROUND OF THE INVENTION

1. Field of the Invention

The present invention relates to an optical sensor, and more particularly, to a light-receiving device, such as an infrared sensor.

2. Description of the Related Art

There are two types of electronic components, that is, a through hole mount device (THD) having a lead terminal and a surface mount device (SMD). The THD is mounted on a substrate having a through-hole. Meanwhile, the SMD is mounted on a surface of a substrate. Similarly, optical sensors such as infrared sensors are classified into two types, that is, a THD and an SMD.

Japanese Unexamined Patent Application Publication No. 2013-524178 discloses a radiation sensor including a radiation sensing element, a housing including a metal cap in which the radiation sensing element is stored, a plurality of terminals, and a circuit. Japanese Unexamined Patent Application Publication No. 11-108757 discloses an infrared sensor including a pyroelectric element, a substrate, and a stem including a metal base and a terminal. Japanese Unexamined Patent Application Publication No. 63-176 discloses an optical sensor in which at least two light-receiving elements are integrally molded with a transparent resin. Japanese Unexamined Patent Application Publication No. 2001-124624 discloses an infrared sensor in which a sensor portion in which an infrared detection element and a room temperature detection element are sealed in a metal package is mounted on a substrate having a lead.

The radiation sensor described in Japanese Unexamined Patent Application Publication No. 2013-524178, the infrared sensor described in Japanese Unexamined Patent Application Publication No. 11-108757, the optical sensor described in Japanese Unexamined Patent Application Publication No. 63-176, and the infrared sensor described in Japanese Unexamined Patent Application Publication No. 2001-124624 are THDs.

Japanese Unexamined Patent Application Publication No. 2016-42080 discloses a radiation sensing device including a radiation sensor chip, an integrated circuit chip coupled with the radiation sensor chip, and an electrical connection provided on a bottom surface of the integrated circuit chip. Japanese Unexamined Patent Application Publication No. 2012-13584 discloses a pyroelectric infrared sensor including a sensor element, a circuit board, a resin holder on which the circuit board is mounted, a shield case that covers an outer peripheral surface of the resin holder, and an output terminal. WO2006/009174A1 discloses an infrared sensor including a pyroelectric element and a base. WO2006/120863A1 discloses an infrared sensor in which an infrared sensor element is stored in a metal package having a box shape. Inside the package, a circuit portion connected to the infrared sensor element is provided. The radiation sensing device described in Japanese Unexamined Patent Application Publication No. 2016-42080, the pyroelectric infrared sensor described in Japanese Unexamined Patent Application Publication No. 2012-13584, the infrared sensor described in WO2006/009174A1, and the infrared sensor described in WO2006/120863A1 are SMDs.

As described above, the radiation sensor described in Japanese Unexamined Patent Application Publication No. 2013-524178, the infrared sensor described in Japanese Unexamined Patent Application Publication No. 11-108757, the optical sensor described in Japanese Unexamined Patent Application Publication No. 63-176, and the infrared sensor described in Japanese Unexamined Patent Application Publication No. 2001-124624 are THDs. A substrate on which a THD is mounted needs to be provided with a through-hole. However, the presence of a through-hole makes it difficult to increase a mounting density and reduce a size of the substrate. Furthermore, a THD cannot be reflow-mounted, and therefore a THD and an SMD cannot be concurrently mounted on a single substrate. This requires a step of mounting a THD and a step of mounting an SMD. Accordingly, in a case where it is necessary to increase a mounting density and reduce a size of a substrate, an SMD, which can be mounted without a through-hole in a substrate, is suitable.

In the optical sensor described in Japanese Unexamined Patent Application Publication No. 63-176, at least two light-receiving elements are integrally molded with a transparent resin. In this case, the light-receiving elements are covered with the transparent resin, and therefore there is a problem that sensitivity decreases due to heat conduction in a case where the light-receiving elements are elements having a heat-based detection principle and a problem that malfunction is likely to occur due to the influence of heat from surroundings in a case where the light-receiving elements are elements that malfunction due to heat. A sensor element is preferably surrounded by air, which has low thermal conductivity, and therefore is desirably a structure supported in midair.

The infrared sensor described in Japanese Unexamined Patent Application Publication No. 2001-124624 includes a circuit board connected to a lead of the infrared sensor, and an electronic component to which the infrared detection element and the room temperature detection element are connected is mounted on this circuit board. It is therefore difficult to reduce a size.

The radiation sensing device described in Japanese Unexamined Patent Application Publication No. 2016-42080 is an SMD but is configured such that the radiation sensor chip and the integrated circuit chip are stacked, and therefore all signal processing circuits need to be included in the integrated circuit chip. Therefore, a degree of freedom of circuit design is low.

Although the pyroelectric infrared sensor described in Japanese Unexamined Patent Application Publication No. 2012-13584 is an SMD, an electronic component that defines a circuit portion is disposed around an infrared sensor element, and it is therefore difficult to reduce a size.

Although the infrared sensor described in WO2006/009174A1 is an SMD, an electronic component that defines a circuit portion needs to be mounted on a device on which the infrared sensor is mounted, and it is therefore difficult to reduce a size.

Although the infrared sensor described in WO2006/120863A1 is an SMD, an electronic component that defines a circuit portion is disposed around an infrared sensor element inside the package, and it is therefore difficult to reduce a size.

SUMMARY OF THE INVENTION

Preferred embodiments of the present invention provide optical sensors, such as infrared sensors, that each have a high degree of circuit design freedom and a small size.

An optical sensor according to a preferred embodiment of the present invention includes a light receiver, and a circuit portion electrically connected to the light receiver, wherein the circuit portion includes a substrate, an electronic component on the substrate, a resin covering the electronic component, and a metal pillar electrically connected to the electronic component and including a portion covered with the resin and a portion exposed from the resin, and the light receiver is located on the circuit portion.

With each optical sensor according to preferred embodiments of the present invention, the light receiver is located on the circuit portion, and therefore a reduction in size is able to be achieved, and a degree of design freedom of the light receiver and the circuit portion is able to be increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
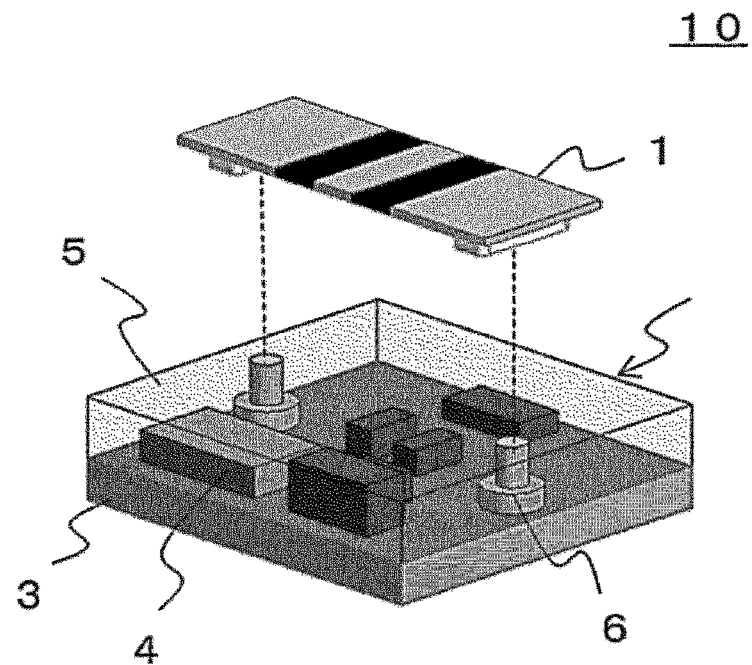
FIG. 1 is a schematic perspective view illustrating a configuration of an optical sensor according to Preferred Embodiment 1 of the present invention.

An optical sensor according to a preferred embodiment of the present invention includes a light receiver, and a circuit portion electrically connected to the light receiver, wherein the circuit portion includes a substrate, an electronic component on the substrate, a resin that covers the electronic component, and a metal pillar that is electrically connected to the electronic component and includes a portion covered with the resin and a portion exposed from the resin, and the light receiver is located on the circuit portion.

According to this configuration, the light receiver is provided on the circuit portion, and therefore a reduction is size can be achieved, and a degree of design freedom of the light receiver and the circuit portion can be increased.

The optical sensor may be configured such that the light receiver is electrically connected to the electronic component by the metal pillar on the resin.

According to this configuration, the light receiver is electrically and mechanically connected to the metal pillar.

The optical sensor may be configured such that the substrate includes a pad and a via hole, and the light receiver is electrically connected to the electronic component on the substrate with the pad and the via hole interposed therebetween.

According to this configuration, the portion of the metal pillar exposed from the resin defines and functions as an external terminal.

The optical sensor may further include a metal cap that covers an upper portion of the light receiver and includes a cavity facing the light receiver, and an optical filter provided in the cavity of the metal cap.

According to this configuration, the light receiver and the circuit portion can be protected, and external noise can be reduced or prevented.

The optical sensor may further include a base substrate or a metal stem connected to the metal cap.

The optical sensor may be configured such that the metal cap is connected at a periphery of the circuit portion.

According to this configuration, in a central portion of the circuit portion, the electronic component can be covered with the resin and the light receiver can be disposed on the circuit portion, and in an outer peripheral portion, the metal cap can be connected to an electrically-conductive portion.

The optical sensor may be configured such that the circuit portion includes an electrically-conductive portion that surrounds the electronic component, and a portion of the electrically-conductive portion is covered with the resin, and another portion of the electrically-conductive portion is exposed from the resin and is connected to the metal cap.

The optical sensor may be configured such that the light receiver is a pyroelectric element.

Optical sensors according to preferred embodiments are described below with reference to the accompanying drawings. The same or substantially the same elements and features are denoted by the same reference signs in the drawings.

Preferred Embodiment 1

FIG. 1 is a schematic perspective view illustrating a configuration of an optical sensor 10 according to Preferred Embodiment 1 of the present invention.

The optical sensor 10 includes a light receiver 1 and a circuit portion 2 electrically connected to the light receiver 1. The circuit portion 2 includes a substrate 3, an electronic component 4 on the substrate 3, a resin 5 that covers the electronic component 4, and a metal pillar 6. The metal pillar 6 is electrically connected to the electronic component 4. A portion of the metal pillar 6 is covered with the resin 5, and another portion of the metal pillar 6 is exposed from the resin 5. As illustrated in FIG. 1, the light receiver 1 is located on the circuit portion 2.

According to the optical sensor 10, the light receiver 1 is located on the circuit portion 2 such that a reduction in size can be achieved. Furthermore, a degree of design freedom of the light receiver 1 and the circuit portion 2 can be increased. In a case where the light receiver 1 is a pyroelectric element having pyroelectricity, a heat capacity can be ensured, and therefore it is possible to prevent malfunction from occurring due to the influence of heat transmitted from an outside.

Elements and features of the optical sensor 10 are described below.

Light Receiver

The light receiver 1 is, for example, an infrared sensor such as a pyroelectric element made of pyroelectric ceramics polarized in a thickness direction. The infrared sensor element may be, for example, a dual infrared sensor including a pyroelectric element. The dual infrared sensor is configured such that two electrodes provided on a surface of the pyroelectric element are connected in series in opposite polarities so that noise concurrently input to the two electrodes is canceled.

Furthermore, the light receiver 1 is provided on the circuit portion 2, that is, on the resin 5 of the circuit portion 2.

Circuit Portion

The circuit portion 2 performs, for example, voltage conversion, amplification of an electric signal output from the light receiver 1. The circuit portion 2 includes the substrate 3, the electronic component 4 mounted on the substrate 3, the metal pillar 6, and the resin 5 that covers the electronic component 4 and a portion of the metal pillar 6.

Substrate

The substrate 3 may be any insulating substrate. The substrate 3 may be, for example, a glass epoxy substrate.

Electronic Component

The electronic component 4 is, for example, an IC device such as a field-effect transistor or a passive component such as a bypass capacitor or a resistor. The electronic component 4 is covered with the resin 5, as described above. The electronic component 4 is connected to the light receiver 1 with the metal pillar 6 interposed therebetween.

Metal Pillar

The metal pillar 6 may be any columnar body made of a metal. The metal pillar 6 is mounted on the substrate 3 and is electrically connected to the electronic component 4. Furthermore, a portion of the metal pillar 6 is covered with the resin 5, and another portion of the metal pillar 6 is exposed from the resin 5 and is electrically and mechanically connected to the light receiver 1.

Resin

The resin 5 covers the electronic component 4. Since the electronic component 4 is covered with the resin 5, an insulating property of the electronic component 4 is secured. The resin 5 is, for example, an epoxy resin, a urethane resin, or a silicone resin. The resin 5 may have a light shielding property. This makes it possible to prevent the electronic component 4 from malfunctioning due to influence of light from an outside even in a case where the electronic component 4 is an IC device. Since the electronic component 4 and a portion of the metal pillar 6 are covered with the resin 5, the circuit portion 2 has water resistance, moisture resistance, and impact resistance.

Method for Manufacturing Optical Sensor

A non-limiting example of a method for manufacturing the optical sensor 10 is described below.

The electronic component 4 is mounted on the substrate 3. The metal pillar 6 is provided. For example, the metal pillar 6 may be provided by mounting a columnar conductor on the substrate 3 or may be formed by plating.

The electronic component 4 and the metal pillar 6 are covered with the resin 5. For example, the electronic component 4 and the metal pillar 6 may be covered with the resin 5 by molding.

A surface of the resin 5 is ground to expose a portion of the metal pillar 6 from the resin 5 while providing a flat surface.

The light receiver 1 is mounted on the resin 5 of the circuit portion 2. As illustrated in FIG. 1, the portion of the metal pillar 6 exposed from the resin 5 is electrically and mechanically joined to the light receiver 1.

In this way, the optical sensor 10 is obtained.

Preferred Embodiment 2

Figure 2:
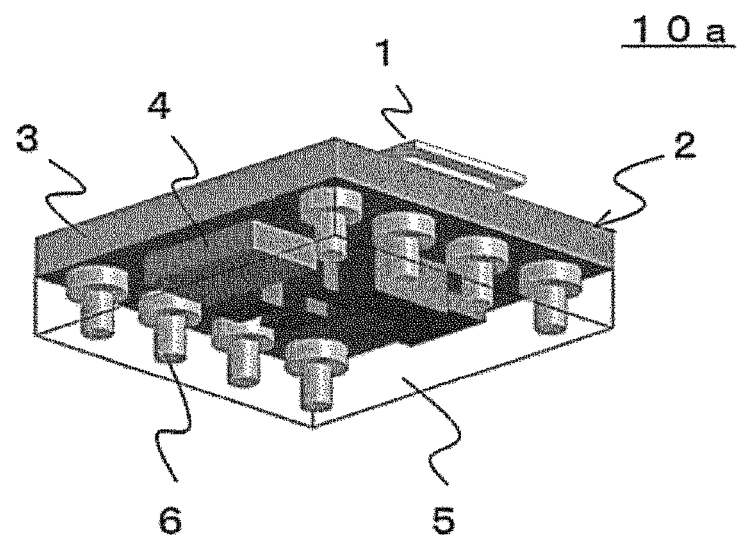
FIG. 2 is a schematic perspective view illustrating a configuration of an optical sensor according to Preferred Embodiment 2 of the present invention.

FIG. 2 is a schematic perspective view illustrating a configuration of an optical sensor 10a according to Preferred Embodiment 2 of the present invention.

The optical sensor 10a is different from the optical sensor 10 according to Preferred Embodiment 1 in that a light receiver 1 is connected to a substrate 3. Specifically, the substrate 3 includes a pad and a via hole (not illustrated), and the light receiver 1 is electrically connected to the electronic component 4 with the pad and the via hole of the substrate 3 interposed therebetween. Furthermore, a portion of a metal pillar 6 is exposed from a resin 5 and defines and functions as an external terminal.

Also in this case, the light receiver 1 is provided on a circuit portion 2 as in Preferred Embodiment 1, and therefore a reduction in size can be achieved. Furthermore, a degree of design freedom of the light receiver 1 and the circuit portion 2 can be increased.

Method for Manufacturing Optical Sensor

A non-limiting example of a method for manufacturing the optical sensor 10a is described below.

The electronic component 4 and the metal pillar 6 are mounted on the substrate 3.

The electronic component 4 and the metal pillar 6 are covered with the resin 5. For example, the electronic component 4 and the metal pillar 6 may be covered with the resin 5 by molding.

A surface of the resin 5 is ground to expose a portion of the metal pillar 6 from the resin 5 while providing a flat surface.

The light receiver 1 is mounted on the substrate 3 of the circuit portion 2. As illustrated in FIG. 2, the portion of the metal pillar 6 exposed from the resin 5 so as to define and function as an external terminal.

In this way, the optical sensor 10a is obtained.

Preferred Embodiment 3

Figure 3:
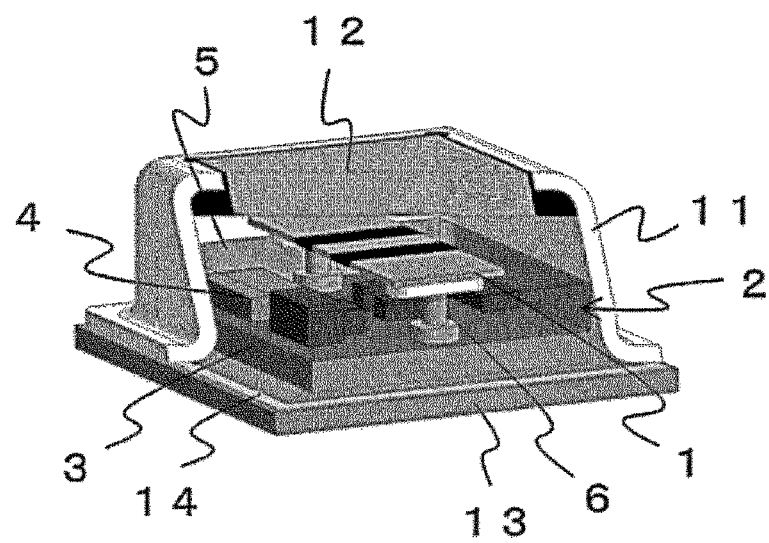
FIG. 3 is a schematic perspective view illustrating a configuration of an optical sensor according to Preferred Embodiment 3 of the present invention.

FIG. 3 is a schematic perspective view illustrating a configuration of an optical sensor 20 according to Preferred Embodiment 3 of the present invention. In FIG. 3, an internal configuration is illustrated while omitting a portion of a metal cap 11 and a portion of an optical filter 12.

The optical sensor 20 is different from the optical sensor 10 according to Preferred Embodiment 1 in that the optical sensor 20 further includes the metal cap 11 that covers a light receiver 1 and includes a cavity facing the light receiver 1, the optical filter 12 provided in the cavity of the metal cap 11, and a base substrate 13. Furthermore, as illustrated in FIG. 3, the light receiver 1 and a circuit portion 2 are mounted on a package defined by the metal cap 11 and the base substrate 13.

According to this configuration, the light receiver 1 and the circuit portion 2 can be protected, and external noise can be reduced or prevented.

Metal Cap

The metal cap 11 is, for example, made of a metal such as phosphor bronze, brass, iron, nickel silver, or 42Ni. The metal cap 11 is not limited to these metals and may be made of other metals.

Optical Filter

The optical filter 12 allows light of a wavelength to be detected by the optical sensor 20 to pass therethrough. For example, in a case where the optical sensor 20 is an infrared sensor, an optical filter that allows an infrared ray having a predetermined wavelength to pass therethrough is used as the optical filter 12.

Furthermore, for example, the optical filter 12 has a shape corresponding or substantially corresponding to the shape of the cavity of the metal cap 11, as illustrated in FIG. 3. The shape of the optical filter 12 is not limited to this and may be a shape different from the shape of the cavity of the metal cap 11.

Base Substrate

The base substrate 13 is made of an insulating material such as, for example, ceramics or a resin and includes a wiring pattern made of a metal. The metal cap 11 is mounted on the base substrate 13.

In the optical sensor 20, an electrically-conductive portion 14 is provided on an outer peripheral portion of the base substrate 13. The metal cap 11 is electrically connected to the electrically-conductive portion 14 of the base substrate 13. A terminal to be connected to an outside is provided on a lower surface of the base substrate 13.

Preferred Embodiment 4

Figure 4:
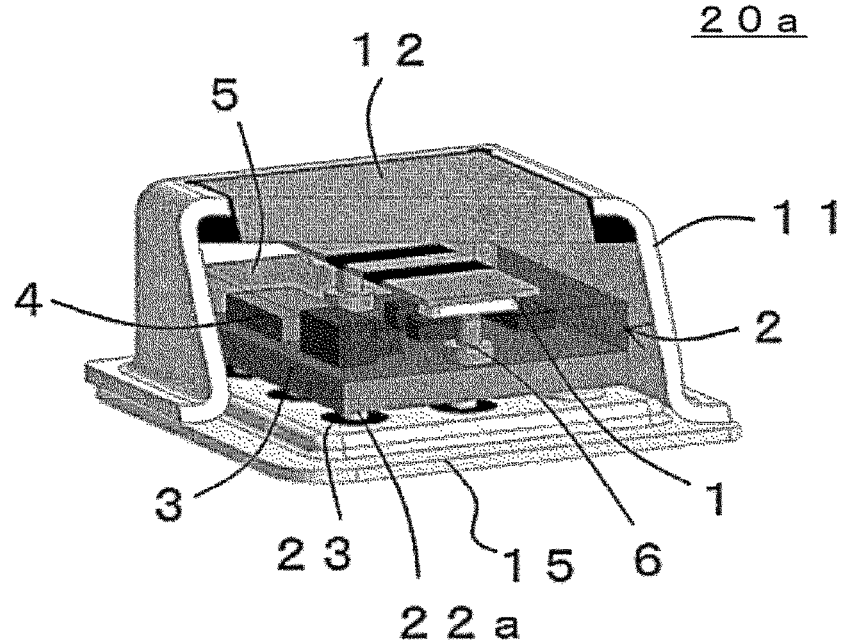
FIG. 4 is a schematic perspective view illustrating a configuration of an optical sensor according to Preferred Embodiment 4 of the present invention.
Figure 5A:
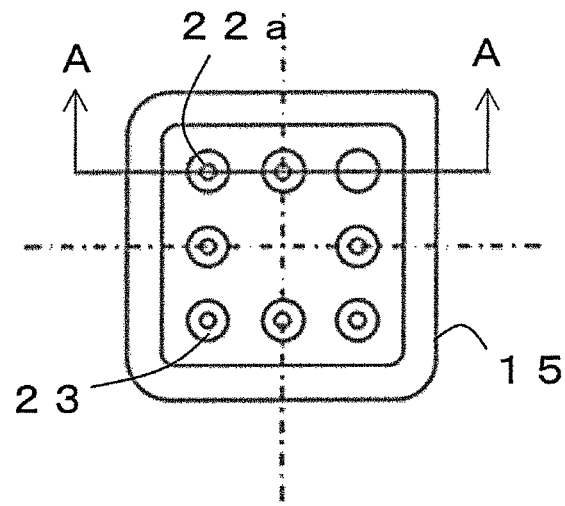
FIG. 5A is a plan view of a metal stem on a bottom surface of the optical sensor of FIG. 4.
Figure 5B:
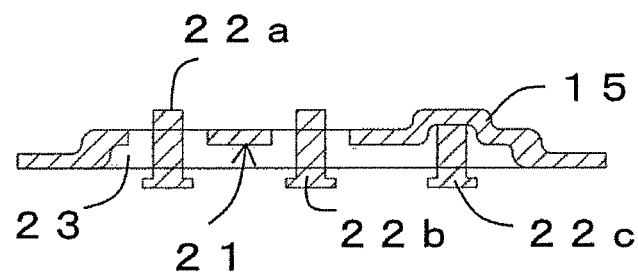
FIG. 5B is a schematic cross-sectional view illustrating a cross section configuration taken along line A-A of FIG. 5A.
Figure 5C:
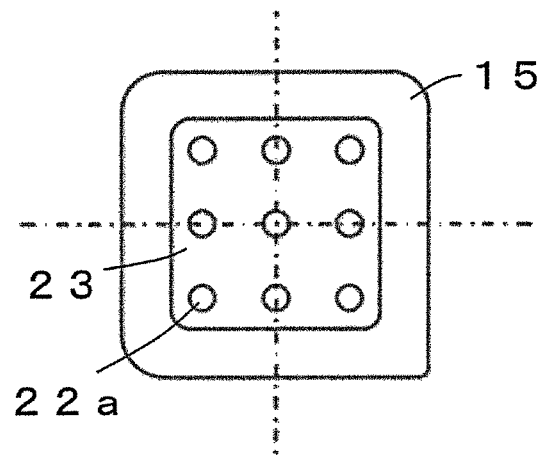
FIG. 5C is a bottom view of the metal stem of FIG. 5A.

FIG. 4 is a schematic perspective view illustrating a configuration of an optical sensor 20a according to Preferred Embodiment 4 of the present invention. FIG. 5A is a plan view of a metal stem 15 on a bottom surface of the optical sensor 20a of FIG. 4. FIG. 5B is a schematic cross-sectional view illustrating a cross section configuration taken along line A-A of FIG. 5A. FIG. 5C is a bottom view of the metal stem 15 of FIG. 5A. In FIG. 4, an internal configuration is illustrated while omitting a portion of a metal cap 11 and a portion of an optical filter 12.

The optical sensor 20a is different from the optical sensor 20 according to Preferred Embodiment 3 in that the optical sensor 20a includes the metal stem 15, instead of the base substrate 13. The metal stem 15 includes a body portion 21, terminals 22a, 22b, and 22c, and an insulating portion 23. The body portion 21 is, for example, formed by drawing. The body portion 21 is made of a metal the same as or similar to a metal of which the metal cap 11 is made. The body portion 21 may be made of a metal different from the metal of which the metal cap 11 is made. Since the body portion 21 is made of a metal, the metal stem 15 is joined to the metal cap 11 by, for example, welding. A central portion of the body portion 21 protrudes from an outer peripheral portion thereof, and the central portion and the peripheral portion of the body portion 21 have the same or substantially the same thickness, and therefore the metal stem 15 includes a recess in a surface opposite to a surface facing the metal cap 11. As illustrated in FIG. 4, the circuit portion 2 is provided on the body portion 21.

The terminals 22a, 22b, and 22c are, for example, columnar bodies made of cobalt.

The terminals 22a, 22b, and 22c are provided in through-holes provided in the body portion 21. The insulating portion 23 is, for example, made of glass, and is provided in the recess of the metal stem 15. As illustrated in FIG. 5B, the insulating portion 23 fills the recess of the metal stem 15. Furthermore, the insulating portion 23 is provided between the through-holes provided in the body portion 21 and the terminals 22a, 22b, and 22c, and the insulating portion 23 insulates the body portion 21 and the terminals 22a, 22b, and 22c from each other. As illustrated in FIGS. 4 and 5B, the terminal 22a and the terminal 22b are connected to the circuit portion 2, and the terminal 22c is connected to the body portion 21.

Preferred Embodiment 5

Figure 6:
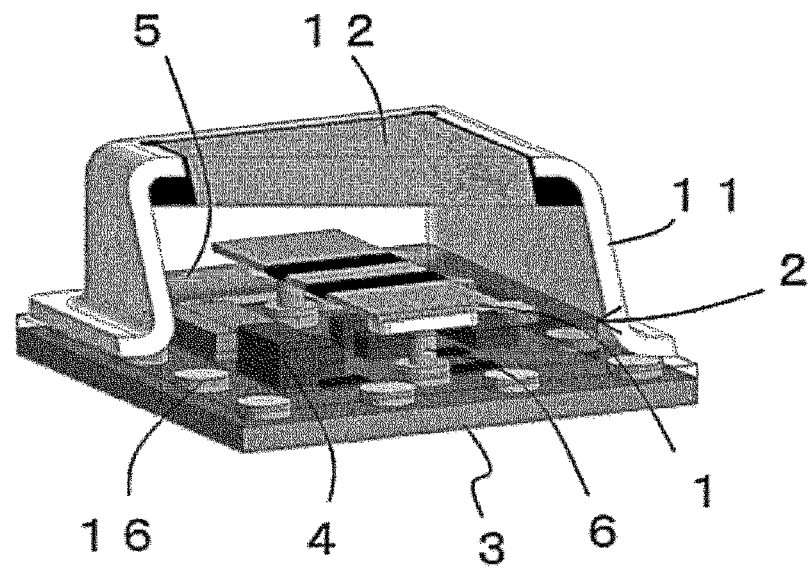
FIG. 6 is a schematic perspective view illustrating a configuration of an optical sensor according to Preferred Embodiment 5 of the present invention.

FIG. 6 is a schematic perspective view illustrating a configuration of an optical sensor 20b according to Preferred Embodiment 5 of the present invention. In FIG. 6, an internal configuration is illustrated while omitting a portion of a metal cap 11 and a portion of an optical filter 12.

The optical sensor 20b is different from the optical sensor 10 according to Preferred Embodiment 1 in that the optical sensor 20b includes the metal cap 11 that covers a light receiver 1 and includes a cavity facing the light receiver 1 and the optical filter 12 provided in the cavity of the metal cap 11 and that the metal cap 11 is connected to an outer peripheral portion of a circuit portion 2. Specifically, a disc-shaped electrically-conductive portion 16 made of a metal is disposed on an outer peripheral portion of a substrate 3 of the circuit portion 2. A portion of the disc-shaped electrically-conductive portion 16 is exposed from a resin 5 of the circuit portion 2, and the metal cap 11 is connected to the outer peripheral portion of the circuit portion 2 by the disc-shaped electrically-conductive portion 16.

The resin 5 has different thicknesses in the central portion and the outer peripheral portion of the circuit portion 2. With this configuration, in the central portion of the circuit portion 2, the electronic component 4 is covered with the resin 5, and the light receiver 1 is disposed on the circuit portion 2. Meanwhile, in the outer peripheral portion of the circuit portion 2, the metal cap 11 is connected to the electrically-conductive portion 16.

Preferred Embodiment 6

Figure 7:
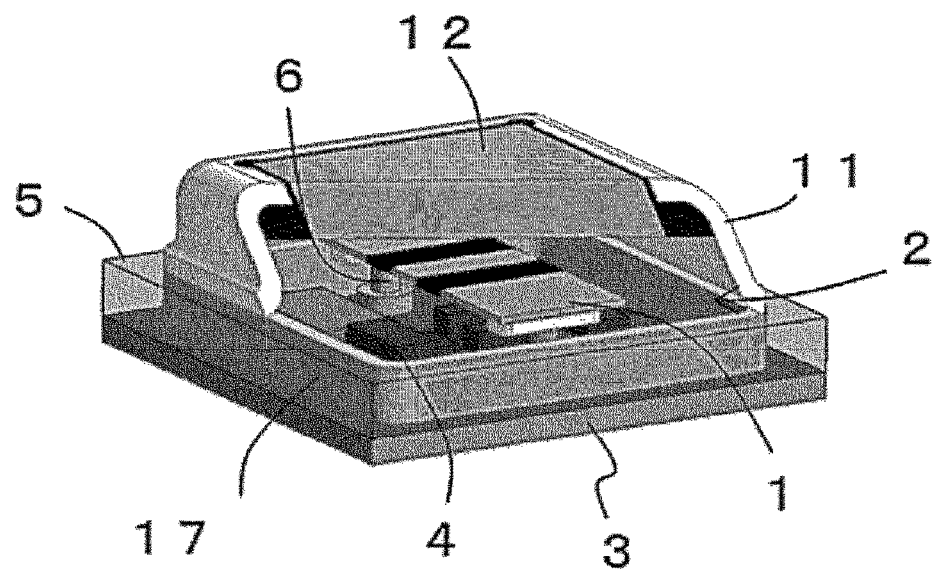
FIG. 7 is a schematic perspective view illustrating a configuration of an optical sensor according to Preferred Embodiment 6 of the present invention.

FIG. 7 is a schematic perspective view illustrating a configuration of an optical sensor 20c according to Preferred Embodiment 6 of the present invention.

The optical sensor 20c is different from the optical sensor 10 according to Preferred Embodiment 1 in that the optical sensor 20c includes a metal cap 11 that covers a light receiver 1 and includes a cavity facing the light receiver 1, an optical filter 12 provided in the cavity of the metal cap 11, and an electrically-conductive portion 17 provided on a circuit portion and that the metal cap 11 is connected to the electrically-conductive portion 17. The electrically-conductive portion 17 has an annular shape and surrounds the electronic component 4. A portion of the electrically-conductive portion 17 is covered with a resin 5, and another portion of the electrically-conductive portion 17 is exposed from the resin 5 and is connected to the metal cap 11.

With this configuration, a base substrate or a metal stem is unnecessary, and a reduction in height can be achieved.

The electrically-conductive portion 17 may have an annular shape as illustrated in FIG. 7. Furthermore, an annular integral shield member made of a metal may be used as the electrically-conductive portion 17.

A portion of the electrically-conductive portion 17 is exposed from the resin 5 and is joined to the metal cap 11 provided with the optical filter 12.

The present disclosure includes appropriate combinations of any of various preferred embodiments and/or examples described above, and advantageous effects of the preferred embodiments and/or examples can be produced.

According to each optical sensor according to preferred embodiments of the present invention, a light receiver is provided on a circuit portion, and therefore a reduction in size can be achieved. Furthermore, a degree of design freedom of a light receiver and a circuit portion can be increased. Therefore, the optical sensors according to preferred embodiments of the present invention are each useful as a small-sized optical sensor having a high degree of design freedom.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An optical sensor comprising:
a light receiver; and
a circuit portion electrically connected to the light receiver;
wherein the circuit portion includes a substrate, an electronic component on the substrate, a resin covering the electronic component, and a metal pillar electrically connected to the electronic component and including a portion covered with the resin and a portion exposed from the resin; and
the light receiver is located on the circuit portion;
the substrate includes at least one insulating layer; and
the metal pillar is made mostly of a conductive material.

2. The optical sensor according to claim 1, wherein the light receiver is connected to the metal pillar on the resin.

3. The optical sensor according to claim 1, wherein
the substrate includes a pad and a via hole; and
the light receiver is electrically connected to the electronic component on the substrate with the pad and the via hole interposed therebetween.

4. The optical sensor according to claim 1, further comprising:
a metal cap covering the light receiver and including a cavity facing the light receiver; and
an optical filter in the cavity of the metal cap.

5. The optical sensor according to claim 4, further comprising a base substrate or a metal stem connected to the metal cap.

6. The optical sensor according to claim 4, wherein the metal cap is connected at a periphery of the circuit portion.

7. The optical sensor according to claim 6, wherein
the circuit includes an electrically-conductive portion surrounding the electronic component; and
a portion of the electrically-conductive portion is covered with the resin, and another portion of the electrically-conductive portion is exposed from the resin and connected to the metal cap.

8. The optical sensor according to claim 1, wherein the light receiver includes a pyroelectric element.

9. The optical sensor according to claim 8, wherein the pyroelectric element is made of a pyroelectric ceramic polarized in a thickness direction.

10. The optical sensor according to claim 1, wherein the substrate includes a glass epoxy.

11. The optical sensor according to claim 1, wherein the electronic component is an IC device or a passive component.

12. The optical sensor according to claim 1, wherein the resin includes at least one of an epoxy resin, a urethane resin, or a silicone resin.

13. The optical sensor according to claim 1, wherein the resin has a light shielding property.

14. The optical sensor according to claim 4, wherein the metal cap includes at least one of phosphor bronze, iron, nickel silver, or 42Ni.

15. The optical sensor according to claim 4, wherein the optical filter has a shape corresponding or substantially corresponding to a shape of the cavity.

16. The optical sensor according to claim 5, wherein
the metal stem includes a body portion, terminals, and an insulating portion;
the body portion is made of metal and connected to the metal cap.

* * * * *